United States Patent [19]

Mitchell et al.

[11] Patent Number: 5,646,553

[45] Date of Patent: Jul. 8, 1997

[54] DRIVER FOR TRI-STATE BUS

[75] Inventors: Bruce W. Mitchell; Mark S. Isfeld, both of San Jose, Calif.

[73] Assignee: 3COM Corporation, Santa Clara, Calif.

[21] Appl. No.: 438,488

[22] Filed: May 10, 1995

[51] Int. Cl.$^6$ .................. H03K 19/0185; H03K 19/00
[52] U.S. Cl. .................. 326/86; 326/93; 326/28; 326/58
[58] Field of Search .................. 326/83, 86, 56–58, 326/93, 95, 98, 21, 28, 30; 370/85.1, 85.2

[56] References Cited

U.S. PATENT DOCUMENTS

| | | | |
|---|---|---|---|
| 4,766,334 | 8/1988 | Warner | 326/86 |
| 5,086,427 | 2/1992 | Whittaker et al. | 370/85.1 |
| 5,115,149 | 5/1992 | Hashimoto | 326/56 |
| 5,225,723 | 7/1993 | Drako et al. | 326/98 |
| 5,251,305 | 10/1993 | Murphy, Jr. et al. | 370/85.1 |

*Primary Examiner*—Edward P. Westin
*Assistant Examiner*—Jon Santamauro
*Attorney, Agent, or Firm*—Wilson, Sonsini, Goodrich & Rosati

[57] ABSTRACT

A tri-state synchronous bus driver avoids contention between succeeding cycles by shutting off each device's output enable early, so that it is guaranteed to no longer drive the line by the time any other device begins to drive. Enable activation occurs on a leading edge of the bus clock, and deactivation occurs at a delayed half phase clock edge. A low current bus holding cell is coupled to each bi-directional line to maintain the driven signal value until it can be sampled by a receiving device. This has the advantages that set up time is not eroded by the technique, and that the disable timing is relatively non-critical. The technique is particularly useful in gate array technology as process, temperature, and voltage variation can cause considerable fluctuation in the actual timing of circuits.

15 Claims, 5 Drawing Sheets

DRIVER FOR TRI-STATE BUS

BACKGROUND OF THE INVENTION

1. Field of the Invention

The present invention relates to tri-state bus drivers used to drive lines on high speed buses; and more particularly to tri-state CMOS drivers which allow different devices to drive the bus on successive data transfer cycles without device contention.

2. Description of Related Art

High speed buses having lines which allow multiple users to drive the line can be termed bi-directional. Several problems are encountered when standard tri-statable CMOS drivers are used to drive bi-directional lines on such buses. One significant problem is caused by imperfect synchronization of the multiple drivers attached to the bus. If there is any overlap between the time one driver is turned off and another driver is turned on, there may be a very large current running between them. The effect of this contention for control of the state of the bus line is described with reference to FIG. 2 below.

The typical method used to eliminate the current spike is to put an off cycle between the times when the signals are driven by different drivers. Unfortunately, this method results in lost cycles. Lost cycles can be particularly painful when there are a lot of small burst transfers from random channels on the bus.

Another way in which the current spike can be reduced is by going with open drain outputs which are tied together and attached to a pull up resistor. In this situation, there is less problem with a change in current since the current is about the same whether one device or two devices are driving the line. The downside of this method is that the only way for a signal to rise is through the pull up resistor. This creates a troublesome tradeoff for high speed buses. That is, small resistors are required to achieve fast rise times. However, small resistors result in an increase in DC current.

Accordingly, it is desirable to provide a high speed, tri-state bus having bi-directional lines which do not suffer the cycle time delay or high current device contention of prior art designs during bus reversal.

SUMMARY OF THE INVENTION

The present invention avoids contention by shutting off each device's output enable early, so that it is guaranteed to no longer drive the line by the time any other device begins to drive, while holding the data on the bus until the end of the transfer cycle. Thus, in one aspect of the invention, enable activation occurs on a leading edge of the bus clock, and deactivation occurs at a delayed half phase clock edge. A low current bus holding cell is coupled to each bi-directional line to maintain the driven signal value until it can be sampled by a receiving device. This has the advantage that set up time is not eroded by the technique, and that the disable timing is relatively non-critical. These techniques are particularly useful in gate array technology as process, temperature, and voltage variation can cause considerable fluctuation in the actual timing of circuits.

Accordingly, the present invention can be characterized as a driver for a particular line of a tri-state bus. The driver includes a data input, coupled to a source of data on the device using the bus, an enable input coupled to enable circuitry, and an output for connection to a particular line on the bi-directional tri-state bus. The driver has a first state responsive to the enable signal which presents a high impedance to the bus. A second state occurs when the enable signal is on, and the data signal on the input has one binary value. The third state occurs when the enable signal is on, and the data signal on the input has another binary value. The enable circuit supplies the enable signal to the enable input of the driver. This enable signal causes turn on transitions in the driver from the high impedance state to one of the second or third states at a particular phase of the data transfer cycle, such as at the rising edge of a bus clock of a synchronous bus. The enable circuit causes turn off transitions of the driver from one of the second and third states to the high impedance state prior to the particular phase of the next cycle. Thus, in a synchronous system the turn off transition may occur between the high-to-low and low-to-high transitions of the bus clock, or at about 60% or 70% of the clock cycle in one embodiment. A bus holding cell is included, coupled to the particular line which holds the data on the particular line between the turn off and turn on transitions of the tri-state driver. The current drive of the bus holding cell is much lower (i.e. less than 30% or preferably less than 10%) than the current drive of the drivers so that the bus holding cell is easily overcome by an enabled driver on the bi-directional line.

According to another aspect of the invention, the enable circuitry includes first and second registers, and a reset signal generator. The first register has a data input connected to a data valid signal from the host device, a clock input connected to receive a clock used to define a bus transfer cycle, such as in this example the bus clock on a bus which is synchronous, and a reset input connected to receive a first reset signal. This first register provides a first valid output which turns on in response to the data valid signal synchronized with the bus clock if the first reset signal is not asserted, and turns off in response to the first reset signal. The second register has a data input connected to receive the data valid signal, a clock input connected to receive the bus clock, and a reset input connected to receive a second reset signal. The second register provides a second valid output which turns on in response to the data valid signal synchronized with the bus clock if the second reset signal is not asserted, and turns off in response to the second reset signal. Combinatorial logic combines the first and second valid outputs to provide the enable signal for the driver. The reset signal generator supplies the first and second reset signals so that the first register supplies the first valid output during a first bus clock cycle and the second register supplies the second valid signal during a second bus clock cycle, and such that the first valid output turns off in response to the first reset signal before the end of the first bus clock cycle, and the second valid output turns off in response to the second reset signal before the end of the second bus clock cycle.

The present invention can also be characterized as a synchronous tri-state bus, which includes a plurality of tri-state drivers such as those described above. The bus holder circuit may be independent of the particular drivers, and/or coupled with one or more of the drivers for each bi-directional line.

According to yet another aspect, the invention can be characterized as a method for controlling a tri-state bus having a bus transfer cycle. The method includes supplying data to the tri-state bus using tri-state drivers responsive to respective enable signals; generating enable signals for the tri-state drivers so that the enable signals turn on synchronized with a first particular phase of the bus transfer cycle and turn off later in the bus transfer cycle prior to the first particular phase in the next cycle. The first particular phase may be synchronized, for instance, with the bus clock on low-to-high transitions of the bus. The turn off need not be synchronized with any bus clock transitions. Thus, the turn off may occur, for instance, between high-to-low and low-to-high transitions of the bus clock. In addition, the method includes holding data on the bus between the turn off of a first cycle and the following first particular phase during which no tri-state driver on the bus is enabled. This holds the value on the bus so that receiving devices can still latch the correct data even between the turn off and the following first phase state. This allows input receiver set up time to overlap with the time between the turn off and the following first phase state.

The present invention is particularly suited to high speed, bi-directional synchronous buses, having bus clocks 25 MHz or higher. For instance, one implementation of the present invention uses a 50 MHz bus clock in which data transfer cycles are synchronized with the 20 nanosecond bus clock cycles.

Thus, the present invention solves the problem of reversing bi-directional buses by imposing a period of time at the end of each data transfer period during which the tri-state output is turned off and a bus holder cell keeps the data on the bus valid. A simple enable circuit can be used to generate the enable signal because the time delay element for turning off the enable signal does not have to be very precise. Also, the fast turn on feature of the invention does not reduce speed, transition times, nor input set up times on the bus. The bus holder circuit holds the high or low value of the bus to its last driven value, when the line is no longer actively driven. When any driver turns on in the following cycle, the drive of the bus holder is easily overcome. Thus, cycle to cycle reversal of the bi-directional bus can be done reliably.

Accordingly, a simple technique for improving the performance of high speed tri-state buses has been provided. This technology is particularly important in high speed applications involving large amounts of I/O data shared amongst a number of users of the bus.

Other aspects and advantages of the present invention can be seen upon review of the figures, the detailed description, and the claims which follow.

DETAILED DESCRIPTION OF PREFERRED EMBODIMENTS

Figure 1:
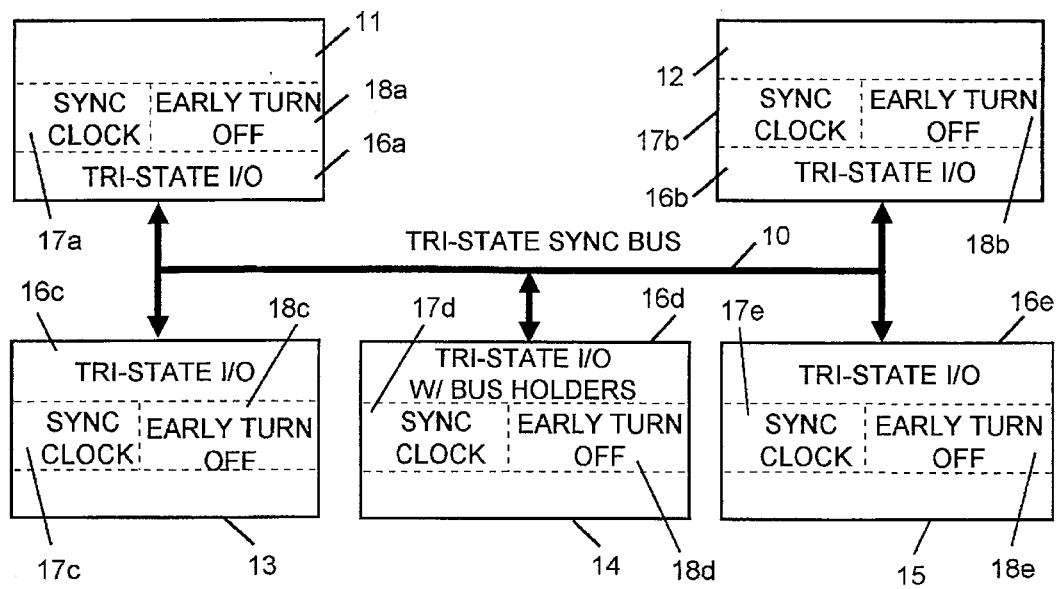
FIG. 1 is a schematic block diagram of a tri-state synchronous bus system according to the present invention.

A detailed description of embodiments of the present invention is provided with reference to the Figures, in which FIG. 1 provides a system block diagram based on a tri-state synchronous bus. As can be seen in FIG. 1, a tri-state synchronous bus 10 is provided which is coupled to a plurality of users of the bus, including a first user 11, a second user 12, a third user 13, a fourth user 14, and a fifth user 15. Each of the users includes a plurality of tri-state I/O drivers, generally 16a through 16e. Further, each of the users 11 through 15 includes a synchronous clock generator or other circuitry, generally 17a through 17e for producing a bus clock. According to the present invention, an early enable turn off circuitry, generally 18a through 18e, is included in each device. At least one of the users, such as user 14, includes bus holder circuits coupled to each bi-directional line on the tri-state synchronous bus. Only the bi-directional drivers on the tri-state bus system suffer the problem addressed by the present invention. Thus, the address and data lines, the read-write control lines, and other control lines which may be driven by multiple users of the bus include the early enable turn off feature of the present invention.

Figure 2:
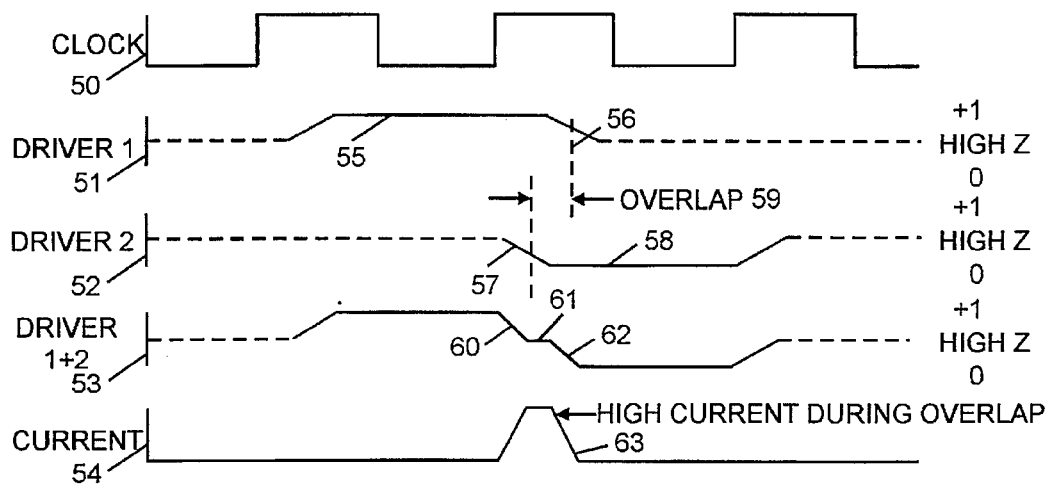
FIG. 2 is a timing diagram illustrating the problems with prior art bus drivers.
Figure 3:
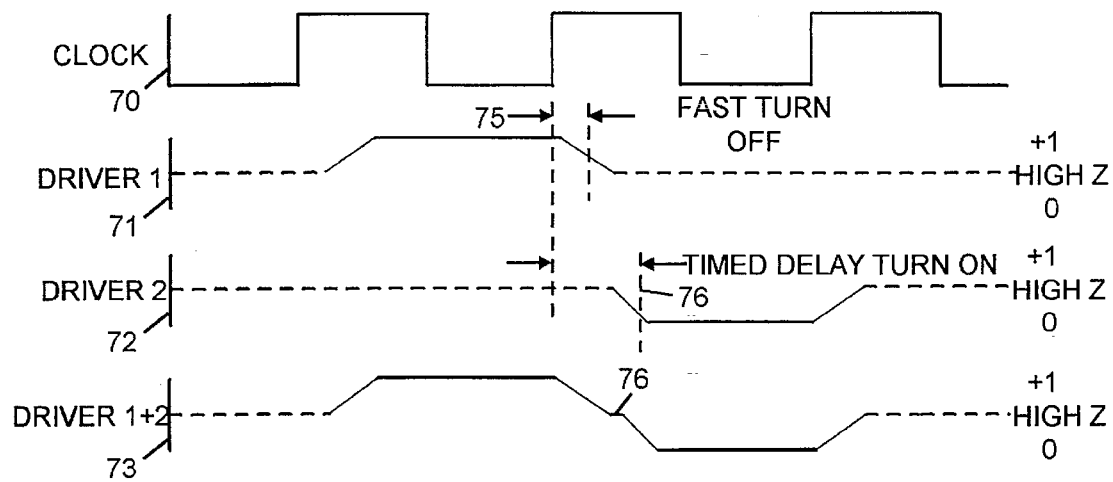
FIG. 3 is a timing diagram illustrating one approach to tri-state bus reversal.
Figure 4:
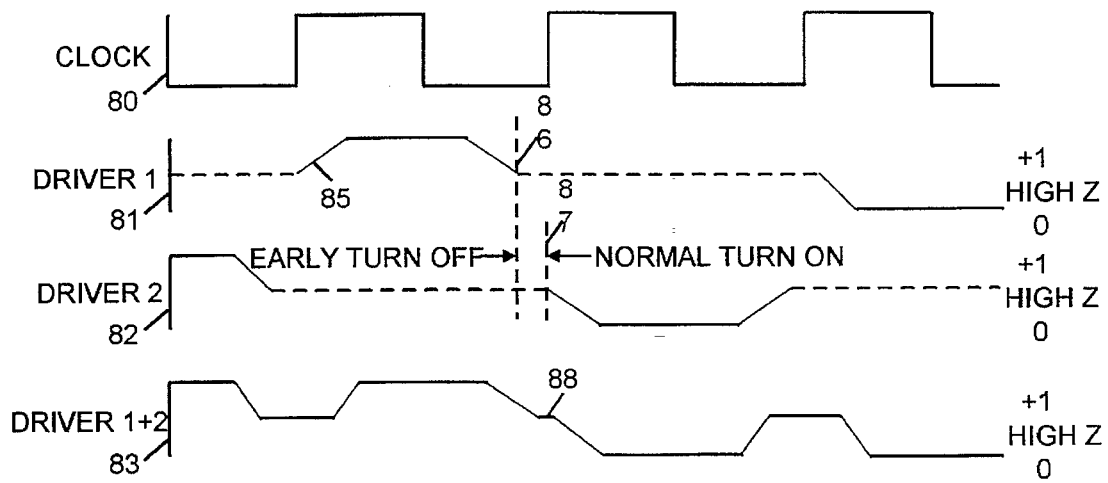
FIG. 4 is a timing diagram illustrating the preferred approach to implementing bus reversal according to the present invention.

The problem solved by the system of FIG. 1 can be understood with reference to FIGS. 2 through 4. In FIG. 2 a problem presented by the prior art is illustrated. For a system not using the present invention, FIG. 2 illustrates a bus clock at trace 50, the output of a first driver on trace 51, the output of a second driver on trace 52, the sum of the outputs of drivers 1 and 2 on trace 53, and the current on the bi-directional line to which the drivers are connected at trace 54. As can be seen, driver 1 is supplying a high voltage during interval 55, and is turned to a high impedance state at time 56. The second driver is in a high impedance state during the initial part of the trace, and is turned on at point 57 to supply a low voltage during the interval 58. This causes an overlap, generally 59, between the outputs of the first and second drivers. As a result of the overlap 59, the voltage on the bus assumes the shape shown at trace 53, going high during interval 55, until the bus driver on trace 52 turns on to the low voltage. This lowers the potential, as shown at segment 60 of trace 53, until the time when both driver 1 and driver 2 are contending for the bus with high and low voltages, respectively, during the segment 61. After the first driver turns off in segment 62, the voltage driven by the second driver is reached on the bus during the interval 58.

When the first and second drivers are opposing one another during the interval 61, a high current spike 63 occurs on the bus as shown at trace 54. Because two drivers on the synchronous bus cannot be perfectly synchronized, it is likely that overlaps will occur when the bus reverses direction. These overlaps create high current spikes which may cause reliability problems, increased noise on power supplies (on and off chip), increased radiated and conducted electrical emissions, overheating, and the like.

FIG. 3 provides a timing diagram for one technique for avoiding the overlapping signals, showing the bus clock at trace 70, the voltage of a first driver at trace 71, the voltage of a second driver at trace 72, and the sum of the first and second drivers on trace 73. As can be seen, according to FIG. 3 the drivers are implemented such that there is a fast turn off time synchronized closely with the rising edge of the clock at point 75. Also, a delayed turn on at point 76 for the second driver is implemented to prevent any overlap. Thus, the first driver is allowed to settle to the high impedance state, e.g. at point 76 on trace 73, before the second driver takes over the bi-directional line. This delayed enable turn on approach allows the use of CMOS drivers without a lost cycle during bus reversal, having lower noise than the standard CMOS drivers and lower DC current than the open drain configuration. Although probably suitable for some applications, this approach erodes signal set up time or transmission time on the bus and therefore may limit bus operation frequency, or makes device timing difficult to achieve.

The preferred early enable turn off solution is illustrated in FIG. 4. In FIG. 4, the bus clock is shown at trace 80, the output of the first driver is shown at trace 81, the output of a second driver is shown at trace 82, and the sum of the outputs of the first and second drivers is shown at trace 83. As can be seen, according to the early enable turn off approach, a first driver turns on synchronized with the bus clock at point 85. The first device turns off at point 86 which is prior to the rising edge of the bus clock. The second driver turns on at point 87 on the succeeding rising edge of the bus clock, after the first driver on trace 81 is allowed to settle to the high impedance state, as shown at trace 83, segment 88. During the interval between the early turn off at point 86 and the synchronized turn on at point 87, a bus holder circuit maintains the signal state on the bi-directional line. No high current spike from contention is caused when the second driver turns on, because the bus holder circuit is readily overcome by the power of the second driver and flips to the state driven by the second driver.

Figure 5:
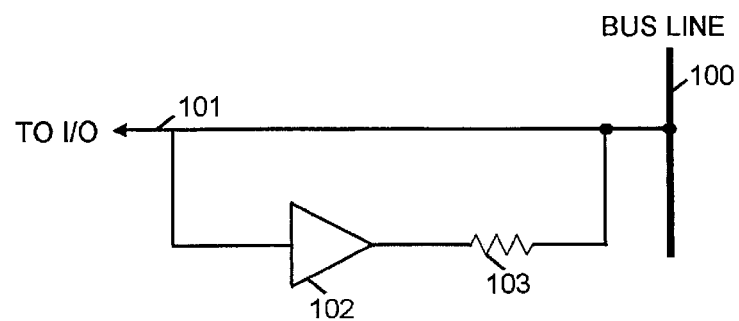
FIG. 5 is a logic diagram of a bus holding circuit for use with the system of FIG. 1.

FIG. 5 provides a basic diagram of bus holding cell on a particular bus line. Thus, FIG. 5 shows a bus line 100 coupled to an I/O port on line 101. A non-inverting amplifier 102 and resistor 103 are coupled in feedback from the line 101 back to the line 101. The non-inverting amplifier 102 takes the data value on the bus line 100 and holds that value through resistor 103 with a relatively low holding current. The bus drivers on the bus line 100 drive sufficient current to overpower the drive of the amplifier 102/resistor 103 combination so that it easily changes states under power of the bus driver.

Figure 6:
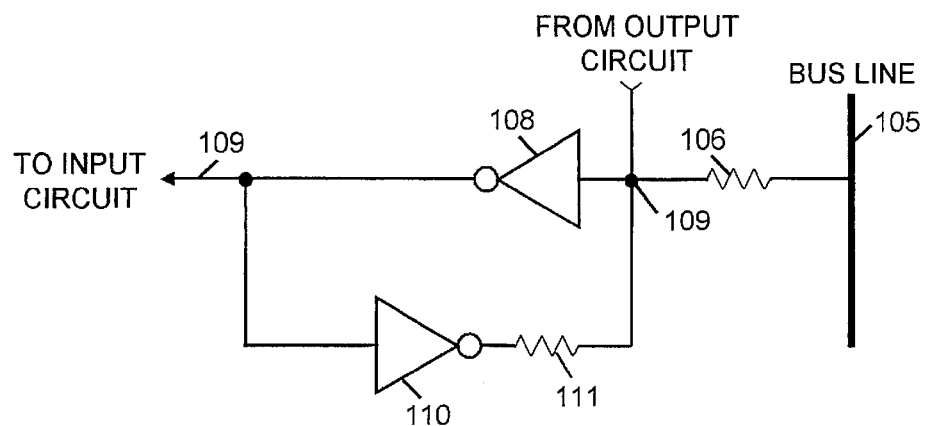
FIG. 6 is a logic diagram of an alternative bus holding cell according to the present invention.

FIG. 6 illustrates an alternative embodiment for the bus holding cell. Thus, a bus line 105 is coupled through a current limiting resistor 106 to an input/output node 107. Output data from the host circuit is supplied at node 107 as illustrated in the figure. An inverter 108 is coupled from the node 107 to input circuitry across line 109 on an integrated circuit for instance using the holding cell. A feedback inverter 110 and resistor 111 are connected in feedback across inverter 108. This provides the function of the non-inverting amplifier discussed above with respect to FIG. 5 in a flip-flop environment. The low drive power of the inverter 110/resistor 111 combination makes the data held at node 107 easily overcome by a bus driver on line 105. It will be appreciated that the resistor 111 may not be a physical device, but incorporated into the structure of the inverter 110 by appropriate transistor sizing or the like.

The bus holder cell of FIG. 5 might by appropriate for a board level implementation, while the circuit of FIG. 6 might be incorporated onto an integrated circuit, because of its low DC current characteristics.

The driving power of the bus holder cell of FIGS. 5 or 6 may be, for instance, as low as 0.1% or less and in one system between 10% and 30%, of the driving power of the bus driver circuitry, limited primarily by requirements for noise immunity on the bus. This driving power can be controlled, for example, by managing the size of the transistors in the feedback inverter 110, and in the bus drivers so that the current capabilities match the desired characteristics.

Figure 7:
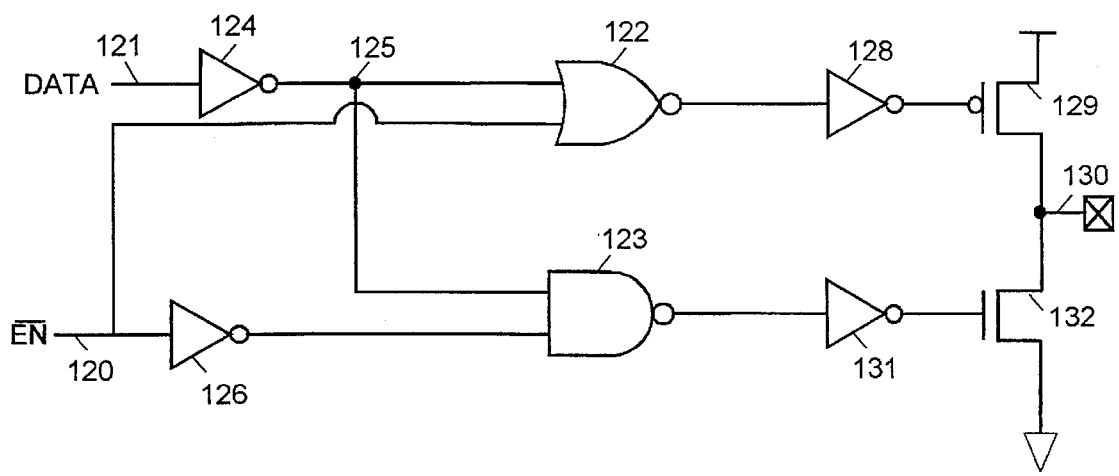
FIG. 7 is a logic diagram of a tri-state driver which may be used in the system of FIG. 1.

FIG. 7 illustrates the basic tri-state driver with an active low enable signal $\overline{EN}$ on line 120. The data input is supplied on line 121 in FIG. 7. The circuit includes a NOR gate 122 and a NAND gate 123. An inverter 124 receives the data signal on line 121 and supplies an inverted version of it on line 125 as inputs to the NOR gate 122 and to the NAND gate 123. The active low enable signal on line 120 is supplied directly to the NOR gate 122, and through inverter 126 as an input to the NAND gate 123. The output of NOR gate 122 drives inverter 128. The output of inverter 128 is connected to the gate of p-channel transistor 129, which has its source coupled to the supply voltage and its drain coupled to the I/O node 130. The output of NAND gate 123 drives inverter 131. The output of the inverter 131 is coupled to the gate of an n-channel transistor 132, which has its source coupled to ground and its drain connected to the I/O output on line 130.

When the active low enable signal on line 120 is high, the output of NOR gate 122 is low, and the output of inverter 128 is high, which turns off transistor 129. Also, the output of inverter 126 is low, the output of NAND gate 123 is therefore high, causing the output of inverter 13 1 to a low state which turns off transistor 132. Therefore, node 130 is in a high impedance state with both transistors 129 and 132 off. When the enable signal on line 120 goes low, the outputs of NOR gate 122 and of NAND gate 123 are controlled by the data signal on line 121. Thus, when the data signal is high, the output of inverter 124 is low, which causes the output of NOR gate 122 to be high, and the output of inverter 128 to be low, turning on transistor 129 and pulling up node 130. At the same time, the output of NAND gate 123 will be high, causing the output of inverter 131 to be low, keeping transistor 132 off. When the data input on line 121 is low, the opposite effect occurs, turning on transistor 132 and turning off transistor 129 to pull down node 130. The sizes of the transistors 129 and 132 are such that they have substantially more current drive than the bus holding circuit in the system according to the present invention.

Figure 8:
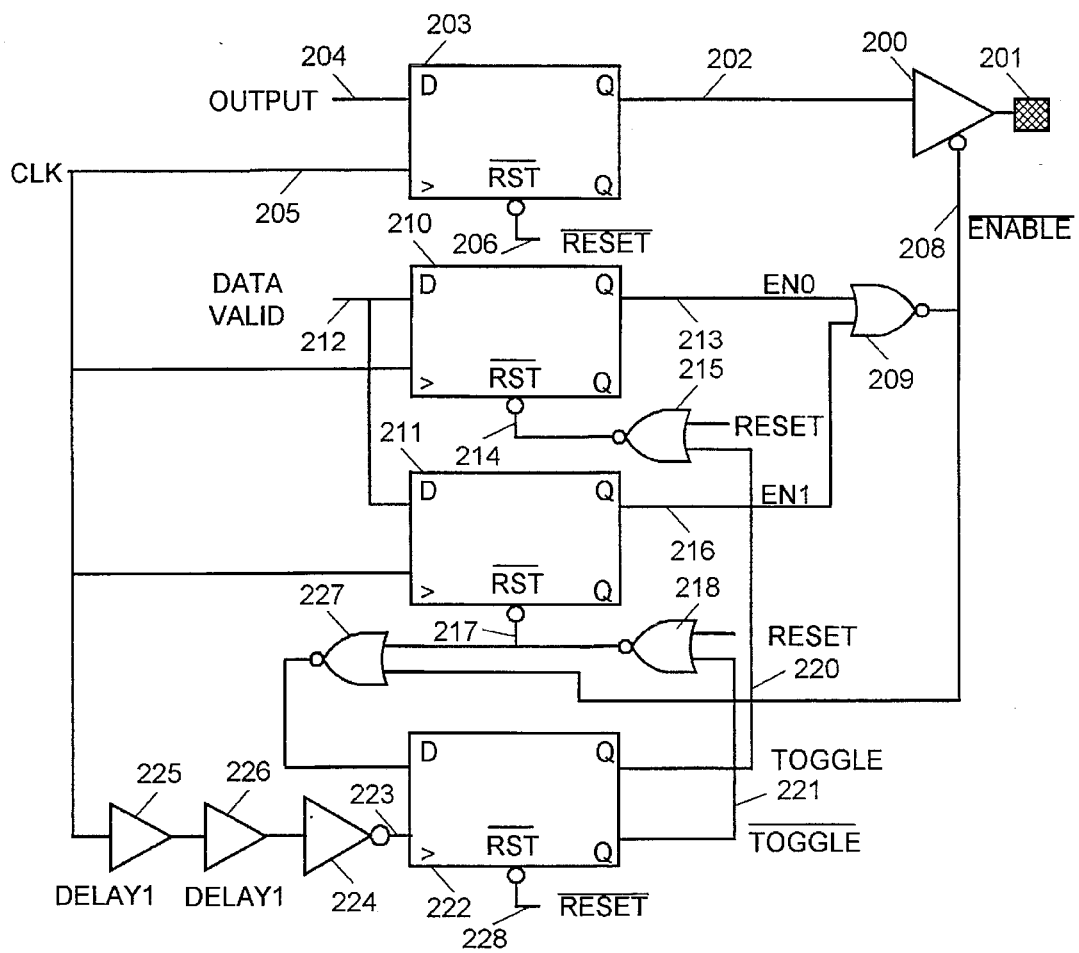
FIG. 8 is a logic diagram illustrating generation of the enable signal and the data signal for input to the tri-state driver for the system of FIG. 1.

FIG. 8 shows the bus driver circuitry according to the present invention, and the enable circuitry for generating the early enable turn off. Thus, the system includes a bus driver circuit 200 which is connected to a bi-directional bus line 201. Line 201 would also be connected an input buffer, such as that shown in FIG. 5, with or without a bus holder circuit, depending on the particular implementation.

The tri-state buffer 200 is driven by a synchronous data signal on line 202 at the output of a register 203. The register 203 receives data output on line 204 from a host device using the bus. The data output on line 204 is latched in the register 203 in response to the bus clock on line 205. A reset signal active low is provided on line 206 in this example. Thus, the register 203 provides for issuing synchronized data to the buffer 200 for supply on the bus line 201.

The buffer 200 is a tri-state buffer having a first state which presents a high impedance to the bus line 201, and second and third states which correspond to the binary logic values of the data on line 202, in which the bus line 201 is driven with a high or low voltage.

The enable signal for the driver 200 is supplied on line 208 at the output of NOR gate 209. The inputs to NOR gate 209 are first and second valid signals en0 and en1 produced using first and second registers 210 and 211, respectively. The register 210 receives a data valid signal on line 212 at its data input, and the bus clock on line 205 at its clock input. The output of register 210 is a first valid signal en0 on line 213. A first reset signal is supplied on line 214 at the output of NOR gate 215 to an active low reset input on the first register 210. The second register 211 is similarly connected, having the data valid signal connected to its data input, the bus clock connected to its clock input, and its output supplied on line 216 as a second valid signal en1. A reset signal on line 217 is supplied at the output of NOR gate 218 and is connected to an active low reset input on the second register 211.

The first and second reset signals are generated in response to respective toggle signals on lines 220 and 221 which are produced using register 222. The register 222 is clocked by the signal on line 223 at the output of inverter 224. The input of inverter 224 is a delayed version of the bus clock from line 205. Thus, a first delay 225 and a second delay 226 are coupled between the bus clock on line 205 and the input of inverter 224.

The data input for register 222 is supplied at the output of NOR gate 227. The inputs to NOR gate 227 include the second reset signal from line 217 which is coupled to the second register 211 and the enable signal on line 208. Also, a reset signal is supplied on line 228 to the register 222. The Q output of register 222 is supplied as the toggle signal on line 220, and the $\overline{Q}$ output is supplied as the toggle output on line 221.

Figure 9:
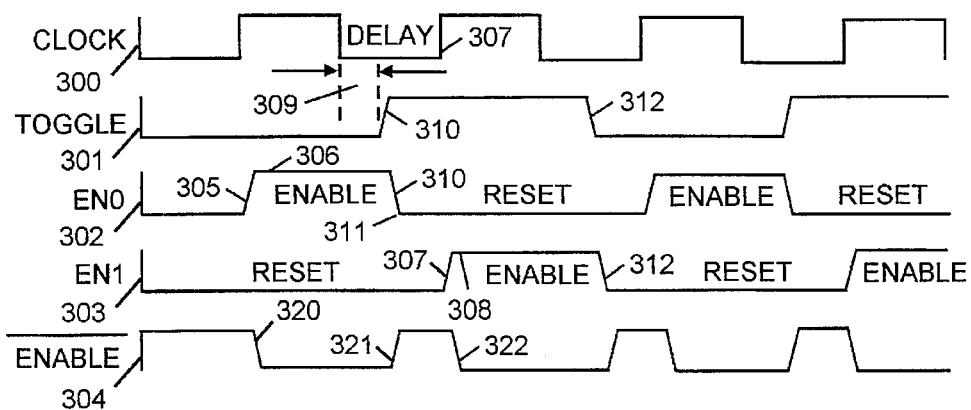
FIG. 9 is a timing diagram illustrating operation of the enable circuitry of FIG. 8.

FIG. 9 illustrates the operation of the enable circuitry to generate the early enable turn off. Thus, FIG. 9 shows the bus clock at trace 300, the toggle signal from line 220 on trace 301, the first valid signal en0 on line 302, the second valid signal en1 on trace 303, and the active low enable signal from line 208 on trace 304. The toggle signal on line 221 is the inverse of trace 301 and not shown. If at the first rising edge of the clock at point 305 the data valid signal on line 212 is high, then the first valid signal en0 will turn on during interval 306. Similarly, at the next rising edge of the bus clock at point 307, the second valid signal en1 will turn on during interval 308. The toggle register 222 will have a high signal at its data input in response to a low signal on line 208. Thus, the falling edge of the bus clock delayed by the interval, shown generally at 309, will cause the second data valid en1 at the output on line 220 of the register 222 shown at trace 301 to go high at point 310. This causes the first register 210 to be reset, turning off the first valid signal en0 on trace 302 at point 311. On the rising edge of the next bus clock at point 307, the second data value en1 at the output of the register 211 goes high because the toggle signal on line 221 is the inverse of that shown on trace 301. On the failing edge of the next succeeding clock and after the delay caused by the delay elements 225 and 226 at point 312, the toggle signal falls, resetting the output of register 211, shown at trace 303. On the next rising edge, the output of register 210 goes high and so on. This results in generation of the active low enable signal as shown at trace 304 at the output of the NOR gate 209. As can be seen, the enable signal turns on at a first particular phase state of the bus clock at transition 320. It turns off at a second particular phase state of the bus clock at transition 321 which is prior to the first particular phase state 322 for the next cycle. Thus, the low enable signal is driven during 60% or 70%, and as much as 99% of the data transfer period, of the bus clock, and turned off for the balance of the bus clock. The bus holder circuit then takes over the bus line, holding it at the driven value, until the next driver takes over.

Figure 10:
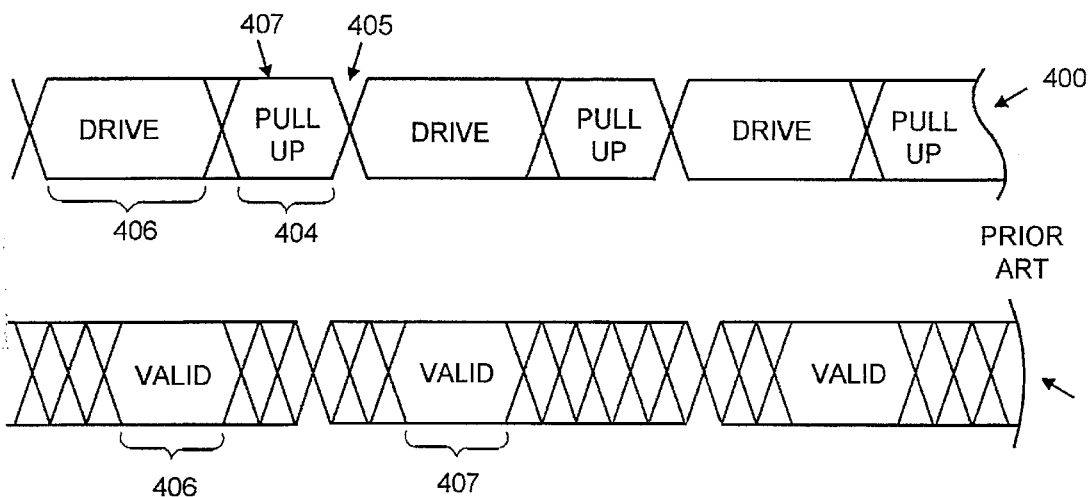
FIG. 10 shows bus timing for valid data in prior art systems.
Figure 11:
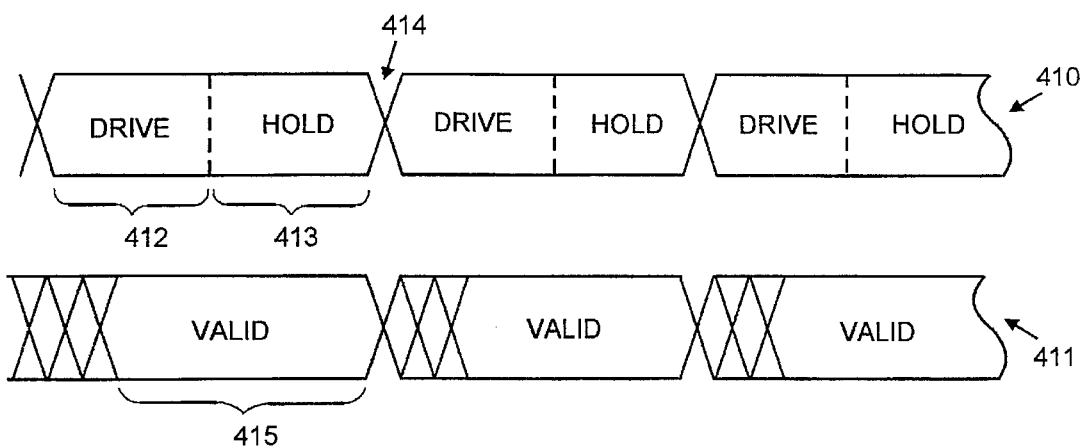
FIG. 11 illustrates bus timing for valid data according to the present invention.

FIGS. 10 and 11 illustrate the advantages of the present invention over the prior art.

FIG. 10 shows the data valid timing in the typical prior art bus driving technique designed to avoid the current spike described above with reference to FIG. 2. Thus, the bus state is shown along trace 400 and the data valid state is shown along trace 401. For a first bus cycle 402, in the prior art, the drivers would be active during the region generally 403. Then, the drivers would stop driving and pullup circuitry would take over during the region 404. This would be followed by a bus transition at point 405. The next bus cycle will have the same configuration with a drive window, a pullup window, followed by a transition. The data valid state as illustrated along trace 401 in the figure would thus only be valid during the region 406 of the first bus cycle and the region 407 of the following bus cycle. A substantial part of the bus bandwidth is consumed by time in which no data is valid on the bus. It will be appreciated that these prior art systems thus do not make effective use of the available bus bandwidth.

FIG. 11 shows a dramatic improvement provided according to the present invention. According to the present invention, the bus state is shown along trace 410 and the bus valid state is shown along trace 411. Thus, during a first bus cycle, the driver is active in region 412 and the bus holder is active in region 413. Next, a transition occurs at point 414. The following bus cycles have similar characteristics with a drive window followed by a hold window and then a bus transition. The data on the bus is valid for each bus cycle during the time 415 for the first bus cycle. As can be seen, this is a substantially wider valid region than is provided in the prior art represented by FIG. 10. That is, the data remains valid throughout the holding window on the bus state. Only when the next bus cycle is driven does a transition occur and a brief period of invalid data happen.

Accordingly, a tri-state synchronous bus is provided which allows for cycle to cycle reversal of bi-directional lines on the bus. This greatly improves bus throughput and efficiency, and allows very high speed synchronous buses to be used even more effectively.

The foregoing description of a preferred embodiment of the invention has been presented for purposes of illustration and description. It is not intended to be exhaustive or to limit the invention to the precise forms disclosed. Obviously, many modifications and variations will be apparent to practitioners skilled in this art. It is intended that the scope of the invention be defined by the following claims and their equivalents.

What is claimed is:

1. An apparatus for driving a particular line of a tri-state, synchronous bus having a bus cycle clock, comprising:

a driver having a data input, having an enable input, and having an output for connection to the particular line, the driver having a first state when an enable signal on the enable input has one value in which the output presents a high impedance to the particular line, a second state when an enable signal on the enable input has another value and a data signal on the data input has one binary value in which the driver supplies a high voltage signal to the particular line and a third state when an enable signal on the enable input has the other value and a data signal on the data input has another binary value in which the driver supplies a low voltage signal to the particular line;

an enable circuit which supplies the enable signal to the enable input of the driver, the enable signal causing turn on transitions in the driver from the first state to one of the second or third states corresponding to data on the data input at a particular phase of a bus cycle, and causing turn off transitions in the driver from one of the second or third states corresponding to data on the data input to the first state before the particular phase of a following bus cycle; and a bus holder circuit, coupled to the particular line, which holds data on the particular line between turn off and turn on transitions of the driver;

wherein the driver includes a register having an input coupled to the data input of the driver, and a clock input coupled to the bus cycle clock, for synchronizing data on the output of the driver with the bus cycle clock.

2. The apparatus of claim 1, wherein the particular phase corresponds to a transition of the bus cycle clock.

3. The apparatus claim 2, wherein the turn off transition occurs between transitions of the bus cycle clock.

4. The apparatus of claim 1, wherein the enable circuit includes circuitry having a data valid input, and a clock input coupled to the bus cycle clock, which generates the enable signal in response to the data valid signal and the bus cycle clock such that the enable signal turns on near the particular phase of the bus cycle clock and turns off before the particular phase of the bus cycle clock.

5. The apparatus of claim 4, wherein the particular phase corresponds to low-to-high transitions of the bus cycle clock.

6. The apparatus of claim 5, wherein the turn off transition occurs between high-to-low and low-to-high transitions of the bus cycle clock.

7. An apparatus for driving a particular line of a tri-state, synchronous bus having a bus cycle clock, comprising:

a driver having a data input, having an enable input, and having an output for connection to the particular line, the driver having a first state when an enable signal on the enable input has one value in which the output presents a high impedance to the particular line, a second state when an enable signal on the enable input has another value and a data signal on the data input has one binary value in which the driver supplies a high voltage signal to the particular line and a third state when an enable signal on the enable input has the other value and a data signal on the data input has another binary value in which the driver supplies a low voltage signal to the particular line;

an enable circuit which supplies the enable signal to the enable input of the driver, the enable signal causing turn on transitions in the driver from the first state to one of the second or third states corresponding to data on the data input at a particular phase of a bus cycle, and causing turn off transitions in the driver from one of the Second or third states corresponding to data on the data input to the first state before the particular phase of a following bus cycle; and a bus holder circuit, coupled to the particular line, which holds data on the particular line between turn off and turn on transitions of the driver;

wherein the enable circuitry includes:

a first register having a data input connected to receive a data valid signal, a clock input connected to the bus cycle clock, and a reset input connected to receive a first reset signal, and providing a first valid output which turns on in response to the data valid signal synchronized with the bus cycle clock if the first reset signal is not asserted and turns off in response to the first reset signal;

a second register having a data input connected to receive the data valid signal, a clock input connected to the bus cycle clock, and a reset input connected to receive a second reset signal, and providing a second valid output which turns on in response to the data valid signal synchronized with the bus cycle clock if the second reset signal is not asserted, and turns off in response to the second reset signal;

combinatorial logic which combines the first and second valid outputs to provide the enable signal for the driver;

a reset signal generator which supplies the first and second reset signals so that the first register supplies the first valid output during a first cycle of the bus cycle clock and the second register supplies the second valid signal during a second cycle of the bus cycle clock, and such that the first valid output turns off in response to the first reset signal before the end of the first cycle of the bus cycle clock and the second valid output turns off in response to the second reset signal before the end of the second cycle of the bus cycle clock.

8. The apparatus of claim 1, wherein the driver comprises CMOS transistors.

9. A synchronous, tri-state bus having a bus cycle clock, comprising:

a plurality of bi-directional signal lines, a plurality of tri-state drivers coupled to each line in the plurality of bi-directional signal lines, the tri-state drivers having a data input, having an enable input, and having an output for connection to a particular bi-directional line in the plurality of bi-directional lines, the driver having a first state when an enable signal on the enable input has one value in which the output presents a high impedance to the particular line, a second state when an enable signal on the enable input has another value and a data signal on the data input has one binary value in which the driver supplies a high voltage signal to the particular line and a third state when an enable signal on the enable input has the other value and a data signal on the data input has another binary value in which the driver supplies a low voltage signal to the particular line;

a plurality of enable circuits, coupled with corresponding tri-state drivers in the plurality of tri-state drivers, the enable circuits supplying the enable signal to the enable input of the corresponding tri-state driver, the enable signal causing turn on transitions in the tri-state driver from the first state to one of the second or third states corresponding to data on the data input at a particular phase of a bus cycle, and causing turn off transitions in the tri-state driver from one of the second or third states corresponding to data on the data input to the first state before the particular phase of a following bus cycle; and a plurality of bus holder circuits, coupled to corresponding bi-directional lines in the plurality of bi-directional lines, which hold data on the corresponding bi-directional lines between turn off and turn on transitions of the tri-state drivers on the corresponding bi-directional lines,;

wherein tri-state drivers in the plurality of tri-state drivers include a register having an input coupled to the data input of the driver, and a clock input coupled to the bus cycle clock, for synchronizing data on the output of the driver with the bus cycle clock.

10. The tri-state bus of claim 9, wherein the particular phase corresponds to a transition of the bus cycle clock.

11. The tri-state bus of claim 10, wherein the turn off transition occurs between transitions of the bus cycle clock.

12. The tri-state bus of claim 9, wherein the enable circuits in the plurality of enable circuits include circuitry having a data valid input, and a clock input coupled to the bus cycle clock, which generates the enable signal in response to the data valid signal and the bus cycle clock such that the enable signal turns on near the particular phase of the bus cycle clock and turns off before the particular phase of the bus cycle clock.

13. The tri-state bus of claim 12, wherein the particular phase state corresponds to low-to-high transitions of the bus cycle clock.

14. The tri-state bus of claim 13, wherein the turn off transition occurs between high-to-low and low-to-high transitions of the bus cycle clock.

15. A synchronous, tri-state bus having a bus cycle clock, comprising:

a plurality of bi-directional signal lines, a plurality of tri-state drivers coupled to each line in the plurality of bi-directional signal lines, the tri-state drivers having a data input, having an enable input, and having an output for connection to a particular bi-directional line in the plurality of bi-directional lines, the driver having a first state when an enable signal on the enable input has one value in which the output presents a high impedance to the particular line, a second state when an enable signal on the enable input has another value and a data signal on the data input has one binary value in which the driver supplies a high voltage signal to the particular line and a third state when an enable signal on the enable input has the other value and a data signal on the data input has another binary value in which the driver supplies a low voltage signal to the particular line;

a plurality of enable circuits, coupled with corresponding tri-state drivers in the plurality of tri-state drivers, the enable circuits supplying the enable signal to the enable input of the corresponding tri-state driver, the enable signal causing turn on transitions in the tri-state driver from the first state to one of the second or third states corresponding to data on the data input at a particular phase of a bus cycle, and causing turn off transitions in the tri-state driver from one of the second or third states corresponding to data on the data input to the first state before the particular phase of a following bus cycle; and a plurality of bus holder circuits, coupled to corresponding bi-directional lines in the plurality of bi-directional lines, which hold data on the corresponding bi-directional lines between turn off and turn on transitions of the tri-state drivers on the corresponding bi-directional lines;

wherein enable circuits in the plurality of enable circuits include:

a first register having a data input connected to receive a data valid signal, a clock input connected to the bus cycle clock, and a reset input connected to receive a first reset signal, and providing a first valid output which turns on in response to the data valid signal synchronized with the bus cycle clock if the first reset signal is not asserted and turns off in response to the first reset signal;

a second register having a data input connected to receive the data valid signal, a clock input connected to the bus cycle clock, and a reset input connected to receive a second reset signal, and providing a second valid output which turns on in response to the data valid signal synchronized with the bus cycle clock if the second reset signal is not asserted, and turns off in response to the second reset signal;

combinatorial logic which combines the first and second valid outputs to provide the enable signal for the driver;

a reset signal generator which supplies the first and second reset signals so that the first register supplies the first valid output during a first cycle of the bus cycle clock and the second register supplies the second valid signal during a second cycle of the bus cycle clock, and such that the first valid output turns off in response to the first reset signal before the end of the first cycle of the bus cycle clock and the second valid output turns off in response to the second reset signal before the end of the second cycle of the bus cycle clock.

\* \* \* \* \*